United States Patent
Mathew et al.

(10) Patent No.: US 11,016,781 B2
(45) Date of Patent: May 25, 2021

(54) METHODS AND MEMORY MODULES FOR ENABLING VENDOR SPECIFIC FUNCTIONALITIES

(71) Applicant: Samsung Electronics Co., Ltd., Suwon-si (KR)

(72) Inventors: Eldho Pathiyakkara Thombra Mathew, Bangalore (IN); Yash Jajoo, Rajasthan (IN); Jai Babu Mahankud, Odisha (IN); Hari Babu Chimakurthy, Andhra Pradesh (IN)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/563,053

(22) Filed: Sep. 6, 2019

(65) Prior Publication Data
US 2020/0341775 A1 Oct. 29, 2020

(30) Foreign Application Priority Data

Apr. 26, 2019 (IN) .............................. 201941016574

(51) Int. Cl.
*G06F 9/4401* (2018.01)
*G06F 12/02* (2006.01)
(Continued)

(52) U.S. Cl.
CPC .......... *G06F 9/4401* (2013.01); *G06F 3/0607* (2013.01); *G06F 3/0632* (2013.01);
(Continued)

(58) Field of Classification Search
CPC .... G06F 9/4401; G06F 3/0607; G06F 3/0632; G06F 3/0679; G06F 12/0246; G11C 8/12; G11C 11/409
(Continued)

(56) References Cited

U.S. PATENT DOCUMENTS

| 6,243,773 B1 * | 6/2001 | Mahalingam | G06F 1/20 710/104 |
| 2008/0189452 A1 * | 8/2008 | Merry | G06F 3/061 710/56 |

(Continued)

FOREIGN PATENT DOCUMENTS

WO WO-2002-009287 A2 1/2002

OTHER PUBLICATIONS

Akhila Gunda et al., "A Case for Near Data Security", University of Utah.

*Primary Examiner* — Henry Tsai
*Assistant Examiner* — Aurangzeb Hassan
(74) *Attorney, Agent, or Firm* — Harness, Dickey & Pierce, P.L.C.

(57) ABSTRACT

Some example embodiments presented herein provide methods and memory modules for configuring vendor-specific registers in the memory modules to enable and/or disable vendor-specific functionality. The vendor-specific register space may be organized by a vendor-specific logic and accessed by a standard memory access command received while the memory is in a programming mode. A write command may be received from a host device to switch the memory module to a programming mode, and the memory module may be switched to the programming mode responsive to the command. A memory write command may be received from the host device involving the memory module switched to the programming mode, and a vendor-specific register may be configured based on the memory write command and the organization of the vendor-specific register indicated by the vendor-specific logic.

16 Claims, 11 Drawing Sheets

(51) Int. Cl.
*G11C 8/12* (2006.01)
*G06F 3/06* (2006.01)
*G11C 11/409* (2006.01)

(52) U.S. Cl.
CPC ........ *G06F 3/0679* (2013.01); *G06F 12/0246* (2013.01); *G11C 8/12* (2013.01); *G11C 11/409* (2013.01)

(58) Field of Classification Search
USPC .......................................................... 710/10
See application file for complete search history.

(56) References Cited

U.S. PATENT DOCUMENTS

| | | | |
|---|---|---|---|
| 2014/0281170 A1* | 9/2014 | Cho | G06F 3/0619 711/103 |
| 2015/0350206 A1 | 12/2015 | Shin et al. | |
| 2016/0217086 A1 | 7/2016 | Shan et al. | |
| 2019/0163364 A1* | 5/2019 | Gibb | G06F 13/4295 |
| 2020/0050401 A1* | 2/2020 | Gibb | G06F 3/0656 |

* cited by examiner

METHODS AND MEMORY MODULES FOR ENABLING VENDOR SPECIFIC FUNCTIONALITIES

CROSS-REFERENCE TO RELATED APPLICATIONS

This application claims priority under 35 U.S.C. § 119(a) to Indian Patent Application No. 201941016574, filed on Apr. 26, 2019, the entire contents of which are incorporated herein by reference as if fully rewritten.

TECHNICAL FIELD

Example embodiments herein relate to memory modules, and more particularly to methods and/or memory modules for enabling vendor-specific functionalities.

BACKGROUND

A memory module may include memory arrays, which are managed by a host device. The memory modules may include devices such as such as Dynamic Random Access Memory (DRAM), Dual Inline Memory Module (DIMM), High Bandwidth Memory (HBM), flash memory, and Non-Volatile DIMM (NVDIMM). Vendors may wish to utilize such memory modules for vendor-specific functionalities including, but not limited to, near data security, near data processing, in-memory security, in-memory computation, post package repairing, and so on.

SUMMARY

Example embodiments are provided to facilitate vendor-specific functionality in memory modules. Such example embodiments include methods and/or memory modules for configuring registers in a vendor-specific register space, in order to enable vendor-specific functionality in the memory module. Some example embodiments may include an example method for configuring a vendor-specific register in a memory module, which may be performed, e.g., by control circuitry of the memory module. The example method may include receiving a command from a host device to switch the memory module to a programming mode. The example method may include switching the memory module to the programming mode responsive to the command. The example method may include receiving a memory write command from the host device involving the memory module switched to the programming mode. The example method may include configuring the vendor-specific register based on the memory write command and an organization of the vendor-specific register indicated by a vendor-specific logic.

Some example embodiments may include a memory module for configuring a vendor-specific register of the memory module. The memory module may include control circuitry that is configured to receive a command from a host device to switch the memory module to a programming mode. The control circuitry may be further configured to switch the memory module to the programming mode responsive to the command. The control circuitry may be further configured to receive a memory write command from the host device involving the memory module switched to the programming mode. The control circuitry may be further configured to configure the vendor-specific register based on the memory write command and an organization of the vendor-specific register based on a vendor-specific logic.

These and other aspects of some example embodiments herein will be better appreciated and understood in conjunction with the following description and the accompanying drawings. It should be understood, however, that the following descriptions, while indicating some example embodiments and numerous specific details thereof, are given by way of illustration and not of limitation. Many changes and modifications may be made within the scope of example embodiments herein without departing from the spirit thereof, and some example embodiments herein may include several or all such modifications.

BRIEF DESCRIPTION OF FIGURES

Example embodiments herein are illustrated in the accompanying drawings, in which like reference letters indicate corresponding parts in the various figures. Some example embodiments herein may be understood from the following description with reference to the drawings, in which.

DETAILED DESCRIPTION

Some example embodiments may cause a device to configure registers in a vendor-specific register space of a memory module, in order to enable and/or disable vendor-specific functionalities in the memory module. The vendor-specific registers may be in various types of memory modules such as, but not limited to, Register Clock Driver (RCD) of Dual Inline Memory Module (DIMM), memory buffer of DIMM, Non-Volatile Dual In-line Memory Module (NVDIMM), Dynamic Random Access Memory (DRAM), High Bandwidth Memory (HBM), flash memory, and so on. Some example embodiments may include configuring the registers in the vendor-specific register space using standard memory Read/Write (RD/WR) commands, which may be received, for example, from a host device through a Command-and-Address (CA) bus. Other example embodiments may utilize specialized or custom commands to configure the registers in the vendor-specific register space. In some example embodiments, a standard memory RD/WR command in the CA bus may include an address field and a data field, wherein the content of the address field may identify an address of a register in the vendor-specific register space and the data field may include data to be written in the register in the vendor-specific register space. The data may cause the memory module to configure the register to enable and/or disable the vendor-specific functionality in the memory module. The operation of the memory module may be controlled based on control signaling, wherein the control signaling may cause the memory module to perform vendor-specific functionalities in the memory module. Some example embodiments may utilize the fields of an RD/WR command to define the address and data fields of one or more vendor-specific registers. The address field may identify a register in the vendor-specific register space, and the data field may indicate the configuration of the register in the vendor-specific register space. For example, the configuration may include defining a boundary of the vendor-specific register between the address and data fields, such as by defining a desired (or, alternatively, predetermined) number of bits in the respective address and data fields. In some example embodiments, the desired number of bits in the respective address and data fields may be specified by a vendor-specific logic, wherein a plurality of memory commands may be cascaded for scaling the address and data bits.

Some example embodiments may enable and/or disable a configuration of the vendor-specific register space without sampling Data (DO) lines and/or irrespective of training of the DQ lines, wherein the configuration may be performed without using Mode Register (MR) space.

Some example embodiments may promote the control and/or performance of vendor-specific operations in memory array of the memory module, based on the vendor-specific functionality, which may be enabled and/or disabled by configuring of the vendor-specific register space.

Figure 1:
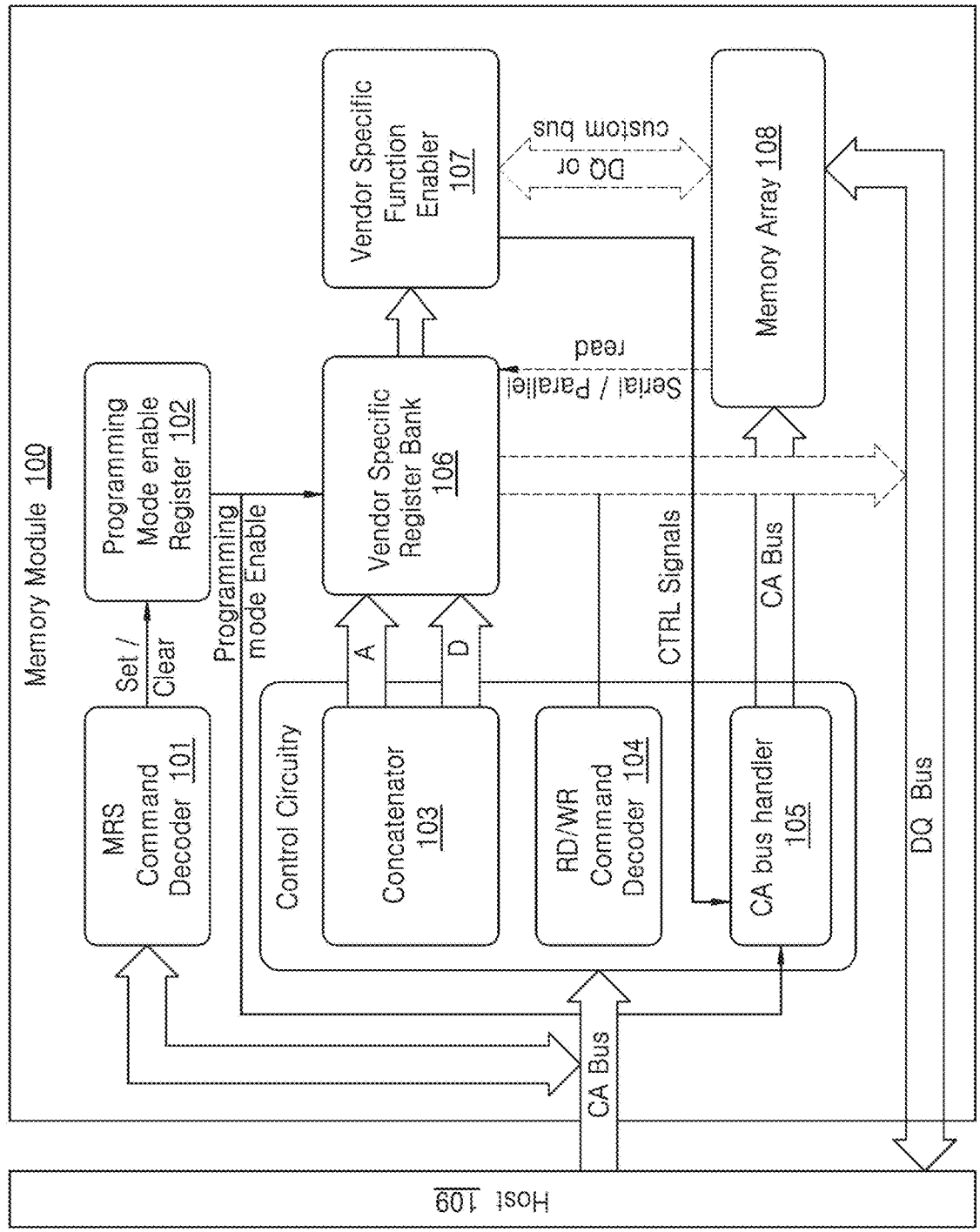
FIG. 1 depicts a memory module capable of performing vendor-specific functions, wherein the memory module is switched to the programming mode using a bit of a Mode Register Set (MRS) command, according to some example embodiments as disclosed herein.

FIG. 1 depicts an example of a memory module 100 that is capable of performing vendor-specific functions, wherein the memory module 100 is switched to the programming mode using a bit of a Mode Register Set (MRS) command, according to some example embodiments as disclosed herein. FIG. 1 may also be understood as presenting an example memory module 100 including control circuitry that is configured to configure the memory module 100 with vendor-specific functionality. In some example embodiments, the memory module 100 may be a DRAM. In some example embodiments, the memory module 100 includes a programming mode setter such as an MRS command decoder 101, a programming mode enable register 102, a concatenator 103, a RD/WR command decoder 104, a CA bus handler 105, a vendor-specific register bank 106, a vendor-specific function enabler 107, a memory array 108, and/or a host device 109. In some example embodiments, the programming mode setter (e.g., the MRS command decoder 101), the concatenator 103, the RD/WR command decoder 104, and the CA bus handler 105 may operate together to configure the vendor-specific register bank 106, which may include a plurality of vendor-specific registers, according to a vendor-specific logic. In some other example embodiments, a different organization may be presented, such as more or fewer elements or a different assignment of functionality to the elements. In some example embodiments, the concatenator 103, the RD/WR command decoder 104, CA bus handler 105 and vender specific function enabler 107 may be implemented by control circuitry such as hardware including logic circuits, a processing unit including software and a core executing the software, or a combination of the hardware and the processing unit.

In some example embodiments, control circuitry of the memory module 100 (e.g., a concatenator of the memory module 100) may be configured to receive the MRS command from a host device 109 through the CA bus. For example, the control circuitry may be configured to direct the memory module 100 to enter into a programming mode responsive to the MRS command, wherein operations, such as a read command and a write command on the memory array 108, are suspended. The control circuitry may configured to select a bit in the MRS space for setting or clearing programming mode enable register 102. In some example embodiments, the control circuitry may be configured to set and/or unset a bit in a standard MRS space to indicate whether the memory module 100 is in the programming mode. Based on the value of the bit, the memory module 100 may be switched to the programming mode. The control circuitry, such as an MRS command decoder 101, may be configured to receive a command through the CA bus and decode the vendor specified MRS command. The control circuitry, such as an MRS command decoder 101, may be configured to set the programming mode enable register 102 in a manner that sets the memory module 100 to the programming mode. The control circuitry, such as the CA bus handler 105, may be configured to receive the MRS command. Thereafter, commands in the CA bus, arriving from the host device 109, may not be able to reach the memory array 108.

Figure 3:
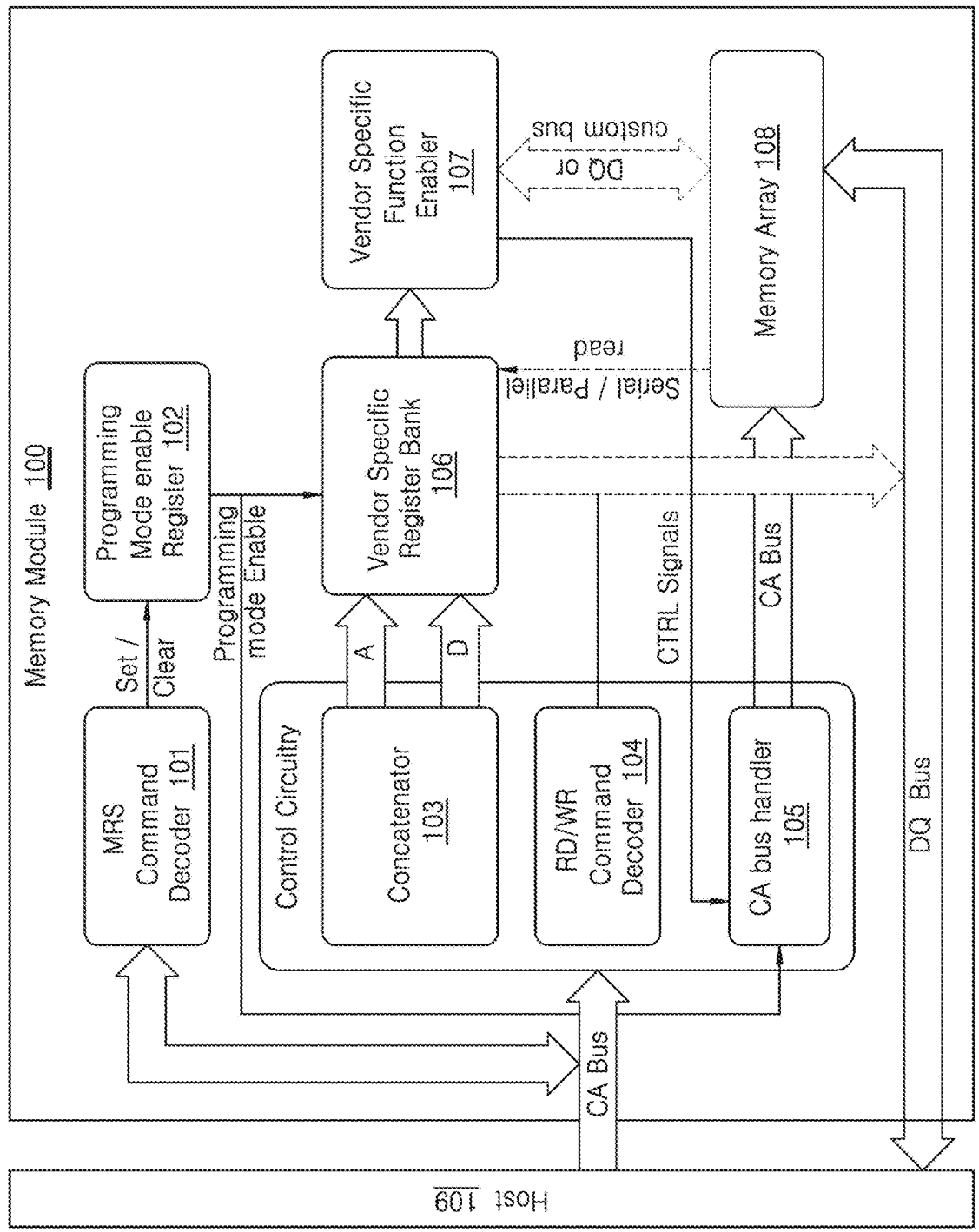
FIG. 3 depicts the memory module, wherein control circuitry of the memory module is configured to switch the memory module to the programming mode using a sequence of commands, according to some example embodiments as disclosed herein.

In some example embodiments, control circuitry of the memory module 100 may be configured to switch the programming mode in a different manner, such as described in an example embodiment depicted in FIG. 3.

In some example embodiments, once the memory module 100 is in the programming mode, the host device 109 may send standard RD/WR commands to the memory module 100. For example, the control circuitry, such as the RD/WR command decoder 104, may be configured to receive the standard memory RD/WR commands from the host device 109 through the CA bus. On condition of the control circuitry receiving a write command, the control circuitry may configure (write) the vendor-specific registers in the vendor-specific register bank 106 in accordance with a vendor-specific logic. On condition of receiving a read command, the control circuitry may be configured to retrieve (read) contents of the vendor-specific registers in vendor-specific register bank 106 for the host device 109 though the DQ bus in accordance with a vendor-specific logic.

In some example embodiments, control circuitry of the memory module 100 (e.g., a RD/WR command decoder 104) may be configured to decode a command received from the host device 109, and may further be configured to determine that the decoded command is a write command. The control circuitry may be configured to receive the write command in order to configure a register in the vendor-specific register bank 106. The vendor-specific register bank 106 may be configured to receive inputs from the control circuitry (e.g., a RD/WR command decoder 104) indicating whether the decoded command is a write command.

In some example embodiments, the control circuitry of the memory module 100 (e.g., a concatenator 103) may be configured to map a command received from the host device 109 (e.g., through the CA bus) to an address of a vendor-specific register in the vendor-specific register bank 106 in accordance with a vendor-specific logic. The control circuitry (e.g., a concatenator) may be configured to configure the register and retrieve contents of the register based on vendor-specific logic. The commands may include an address field and a data field. If the command received from the host device 109 is a write command, the control circuitry may be configured to identify contents of the address field that identifies a vendor-specific register to be configured. The control circuitry may be configured to configure the vendor-specific register based on the contents of the data field. If the command received from the host device 109 is a read command, the contents of the address field may identify the vendor-specific register whose contents are to be read. The data field of the read command may be disregarded.

In some example embodiments, the vendor-specific logic may allow interpreting a standard write command such that registers in the vendor-specific register bank 106 may be configured. In an example embodiment, the standard write command address may include fields such as, but not limited to, row, column, bank group and bank. The fields may be organized or arranged in any specific order. In the position of the address and data fields, the address and the data fields may be included. The concatenator 103 may define a boundary to segment the address and data fields in the write and read commands according to the specifications of the vendor. The bits in the address field identify a register and the bits in the data field may cause the memory module 100 to configure the register to enable and/or disable a vendor-specific functionality. The concatenator 103 may organize the address and data fields in the write command according to the specifications of the vendor.

In some example embodiments, the width of a standard write command may be 28 bits. The concatenator 103 may organize the 28 bits, such that the first 8 bits (from left) constitute the address field and the next 20 bits constitute the data field. The concatenator 103 may accordingly define the boundary.

As depicted in FIG. 1, the address bits of a command may be sent to registers in the vendor-specific register bank 106 through the 'A' bus, and the data bits may be sent through the 'D' bus.

In some example embodiments, the concatenator 103 may cascade a plurality of write commands in order to scale the number of the bits in the address and data fields. For example, the host device 109 may send a plurality of standard write commands for configuring a plurality of registers in the vendor-specific register bank 106.

In some example embodiments, once registers in the vendor-specific register bank 106 are configured, the control circuitry (e.g., the vendor-specific function enabler 107) may enable corresponding vendor-specific functionality on the memory array 108. Based on the configuration of the registers in the vendor-specific register bank 106, the control circuitry (e.g., the vendor-specific function enabler 107) may be configured to send control signals to the CA bus handler 105 to control operations performed on the memory array 108, such as modifying operations on the memory array 108; restricting operations on the memory array 108; enabling operations on the memory array 108, including enabling vendor-specific functions; and/or disabling operations on the memory array 108, including disabling vendor-specific functions. The control circuitry (e.g., the vendor-specific function enabler 107) may be configured to access data stored in the memory array 108 and process the data stored in the memory array 108. In some example embodiments, the control circuitry (e.g., the vendor-specific function enabler 107) may also disable corresponding vendor-specific functionality on the memory array 108.

In some example embodiments, once the registers in the vendor-specific register bank 106 are configured, the host device 109 may send another MRS command that causes the control circuitry to switch the memory module 100 out of the programming mode. This MRS command may be received by an MRS command decoder 101, and stored by the programming mode enable register 102. The controller may fetch the MRS command and resume operations between the host device 109 and the memory array 108 through the CA bus.

FIG. 1 shows an example embodiment including units of the memory module 100, but it is to be understood that other embodiments are not limited thereon. In some other example embodiments, the memory module 100 may include fewer or more units. Further, the labels or names of the units in FIG. 1 are used only for illustration of the example embodiment of FIG. 1. In some example embodiments, one or more units may be combined together to perform same or substantially similar function in the memory module 100.

Figure 2:
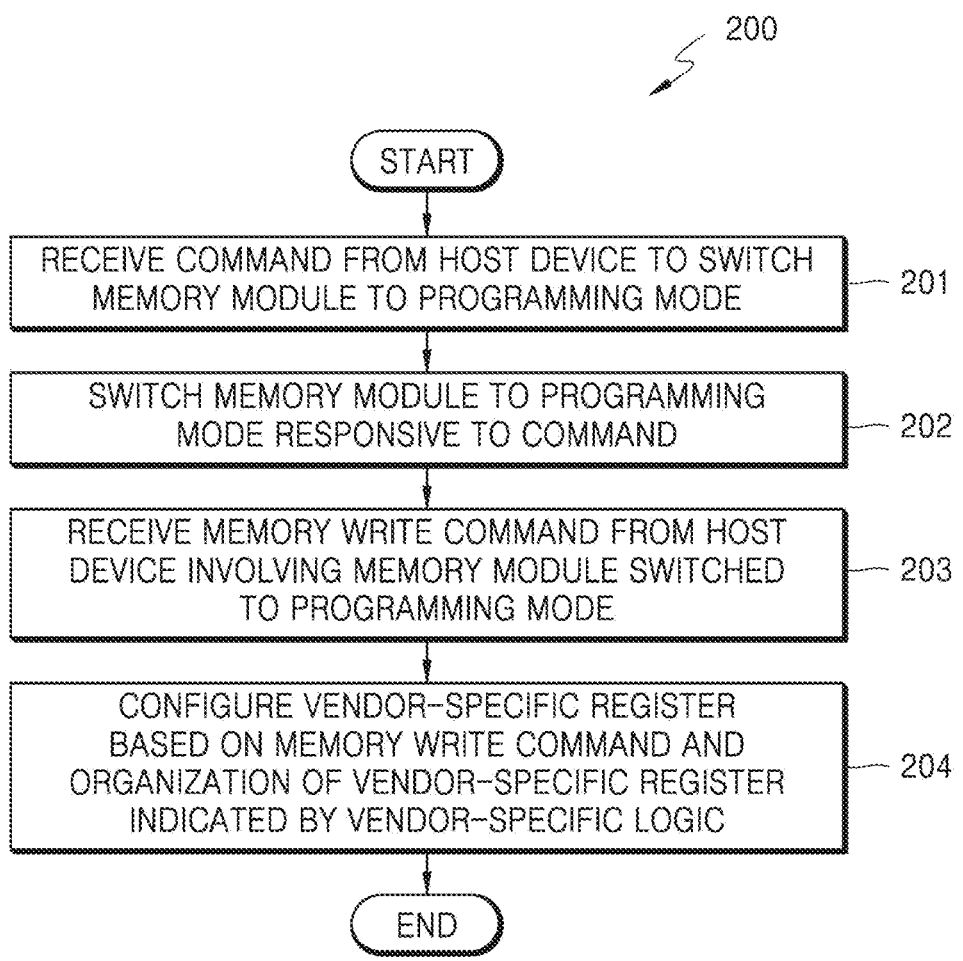
FIG. 2 is a flowchart depicting a method of enabling vendor-specific functionalities in the memory module by configuring registers in the vendor-specific register bank, according to some example embodiments as disclosed herein.

FIG. 2 is a flowchart 200 depicting an example method of enabling vendor-specific functionalities in the memory module 100 by configuring a vendor-specific register according to some example embodiments as disclosed herein.

At step 201, the example method includes receiving one or more commands from a host device to switch the memory module 100 to a programming mode, may be performed, for example, by a CA bus handler.

At step 202, the example method includes, responsive to the (one or more) command from a host device, setting the memory module 100 in a programming mode, which may be performed, for example, by a programming mode setter such as an MRS command decoder 101.

At step 203, the example method includes receiving a memory write command from the host device involving the memory module 100 switched to the programming mode, which may be performed, for example, by a concatenator 103.

At step 204, the example method includes configuring a vendor-specific register based on the memory write command and an organization of the vendor-specific register indicated by the vendor-specific logic, which may be performed, for example, by a concatenator 103.

In some example embodiments, the memory command sent by the host device 109 may be a write command. For example, the host device 109 may send a bank activate command prior to sending the write command, if captured row address in the concatenation is to be updated. The bits of the write command may be interpreted as address or data fields based on a vendor-specific logic.

In some example embodiments, the bits of the write command may be organized as an address field and a data field. In some example embodiments, a vendor-specific logic may indicate a number of bits, such as a desired number of bits that constitute the address field and the number of bits constituting the data field. In some example embodiments, the address bits may identify a specific register in the vendor-specific register bank 106, for example, in the manner of a pointer or an index. The data bits may cause the control circuitry to configure the register to enable vendor-specific functionality.

In an example embodiment, the number of bits constituting the address field and the number of bits may be scaled by cascading a plurality of write commands.

In some example embodiments, the configuration of the registers may be independent of the DO lines, such that configuring the registers in the vendor-specific register bank 106 may not involve sampling the DQ lines. In some example embodiments, the registers in the vendor-specific register bank 106 may be configured prior to the calibration of the DQ lines, such as establishing the timing of signals and/or the configuration of the data bus. In some example embodiments, commands from the host device 109, which are used for configuring the registers in the vendor-specific register bank 106, may be received only via the bus.

In some example embodiments, the control circuitry may include enabling vendor-specific functionality in the memory module 100 based on the configuration of the registers in the vendor-specific register bank 106. In some example embodiments, the control circuitry may be configured to access, process, and/or modify the data stored in the memory array 108, store new data in the memory array 108, and so on, based on the configuration of the registers in the vendor-specific register bank 106, which enables the vendor-specific functionality in the memory array 108. In some example embodiments, the control circuitry may be configured to disable vendor-specific functionality in the memory module 100 based on the configuration of the registers in the vendor-specific register bank 106.

For example, a vendor-specific register in the vendor-specific register bank 106 may be configured to restrict write operations and to allow read-only operations to be performed in registers of the memory array 108, specified by an address range. The control circuitry (e.g., the vendor-specific function enabler 107) may send a control signal to the CA bus handler 105, which may allow only read operations to be performed in the registers, pointed by addresses falling within specified address range. The control signal may indicate the start address and the end address of the specified address range, in which read-only operation is to be performed. Such restriction may secure the data stored in the registers of the memory array 108 that are pointed by addresses within the specified address range. When the memory module 100 is not in the programming mode, a write command arrives in the CA bus, wherein the write operation may be performed in a memory register with an address within the specified address range. In such a situation, the control circuitry (e.g., the CA bus handler 105) may be configured to prevent the write operation by blocking the CA bus to memory array 108. The control circuitry (e.g., the CA bus handler 105) may allow read operations to be performed in the memory registers by opening the CA bus.

Figure 4A:
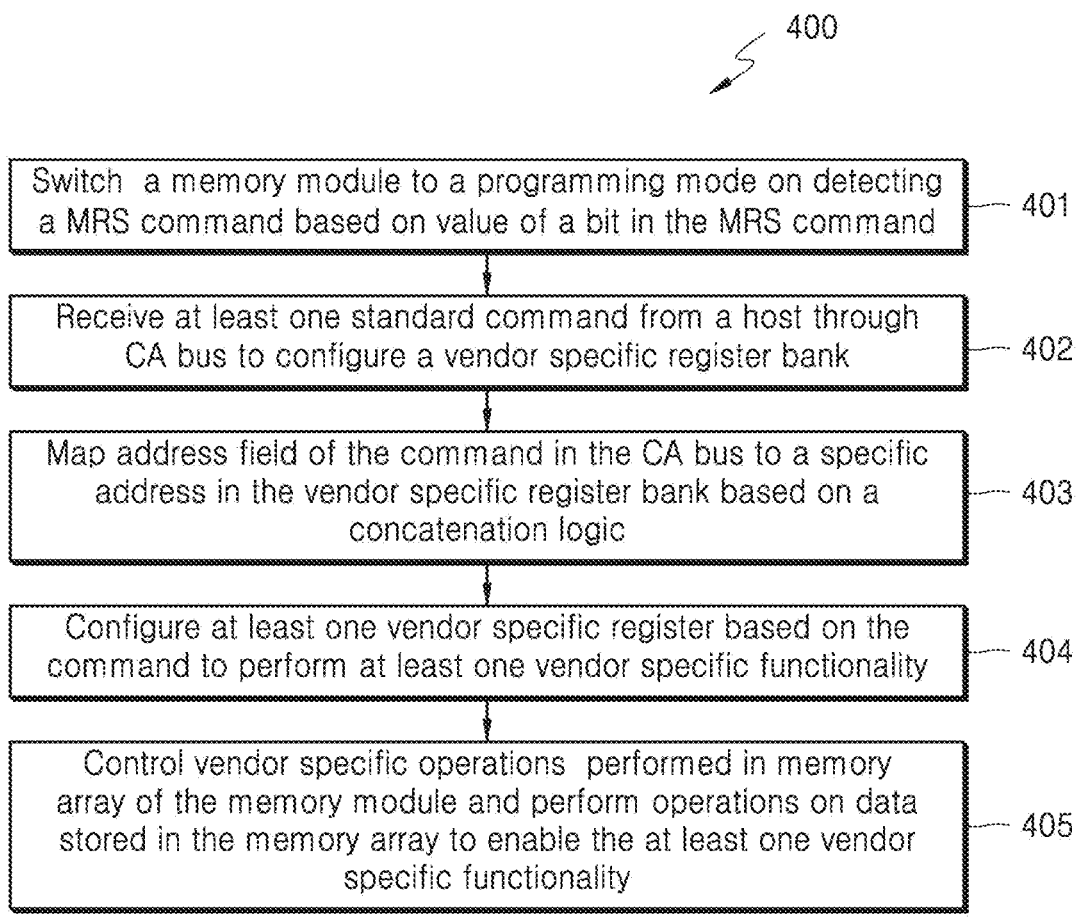
FIG. 4A is a flowchart depicting a first example method of enabling vendor-specific functionalities in the memory module by configuring registers in the vendor-specific register bank, according to some example embodiments as disclosed herein.
Figure 4B:
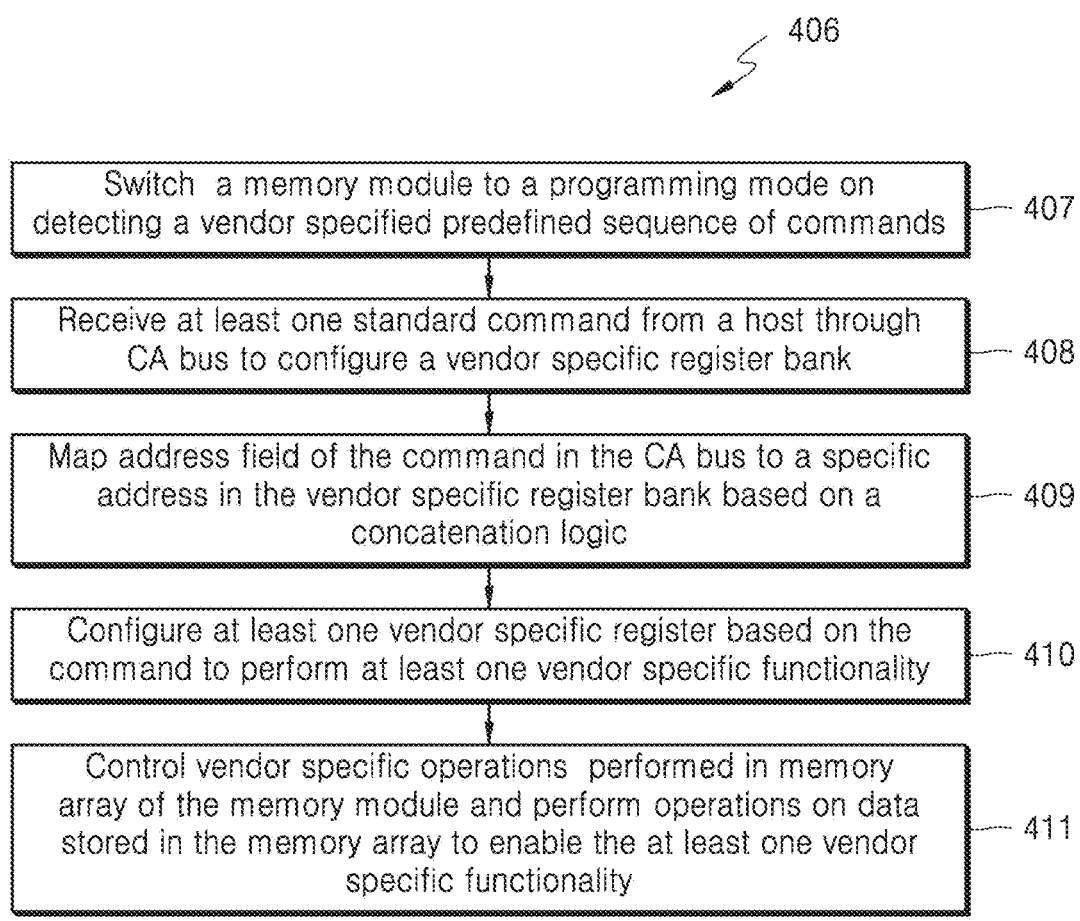
FIG. 4B is a flowchart depicting a second example method of enabling vendor-specific functionalities in the memory module by configuring registers in the vendor-specific register bank, according to some example embodiments as disclosed herein.

Each of the flowcharts presented and discussed herein, including FIGS. 2, 4A, and 4B, depict a set of operations that are arranged in a certain order. However, it is to be appreciated that the arrangement of the operations in each flowchart depicts only one example, and that operations may be added, removed, reordered, and/or performed concurrently in accordance with the subject matter of the present disclosure.

The various operations in the flowchart 200 may be performed in the order presented, in a different order, or simultaneously. Further, in some embodiments, some operations listed in FIG. 2 may be omitted.

FIG. 3 depicts the memory module 100, wherein the memory module 100 (e.g., the control circuitry) is configured to switch to the programming mode based on a sequence of commands, according to some example embodiments as disclosed herein. As depicted in FIG. 3, the control circuitry includes a command sequence decoder 301 as a programming mode setter rather than an MRS command decoder 101.

In an example embodiment, the control circuitry may be configured to receive a sequence of commands from the host device 109 through the CA bus. The command sequence may be defined by a specific vendor. The command sequence may cause the control circuitry to switch to (e.g., enter or initiate) the programming mode. The control circuitry (e.g., the command sequence decoder 301, operating as a programming mode setter) may be configured to receive the sequence of commands in the CA bus, decode the command sequence, and set the programming mode enable register 102 using the command sequence(s), thereby switching the memory module 100 to the programming mode. In some example embodiments, the control circuitry (e.g., the CA bus handler 105) may retrieve the command sequence(s) and in response switch the memory 100 to the programming mode.

FIG. 4A is a flowchart 400 depicting a first example method of enabling and/or disabling vendor-specific functionalities in the memory module 100 by configuring registers in the vendor-specific register bank 106, according to some example embodiments as disclosed herein.

At step 401, the first example method includes switching the memory module 100 to the programming mode, which may be performed, by control circuitry (e.g., a programming mode setter such as an MRS command decoder 101). In some example embodiments, while the memory module 100 is in the programming mode (e.g., in response to a command, or after the programming mode setter has switched the memory module 100 to the programming mode and before the programming mode setter has switched the memory module 100 out of the programming mode), other operations between the host device 109 and the memory array 108 may be restricted or suspended. In this example method, an MRS command is used for switching the memory module 100 to the programming mode. The control circuitry may switch the memory module 100 to a programming mode (e.g., by a programming mode setter) based on the value of a bit in the MRS command. In some example embodiments, the control circuitry may be configured to fetch the MRS command and switch the memory module 100 to the programming mode.

At step 402, the first example method includes receiving one or more memory commands from the host device 109 through the bus, which may be performed, for example, by a concatenator 103. The memory command may be a read command that causes the control circuitry of the memory module 100 to read contents of vendor-specific register and/or a write command that causes the control circuitry of the memory module 100 to configure a vendor-specific register to enable and/or disable a vendor-specific functionality on the memory module 100.

At step 403, the first example method includes mapping the address field of the memory command in the bus to a specific address in the vendor-specific register bank 106, which may be performed, for example, by control circuitry of the memory module 100 (e.g., a concatenator 103). In some example embodiments, the host device 109 may send a write command to the memory module 100 through the bus. In some example embodiments, the address field of the write command may identify a vendor-specific register to be configured. In some example embodiments, the host device 109 may send a read command to the memory module 100 through the bus. In some example embodiments, the address field of the read command may identify a vendor-specific register whose content is to be read.

If the memory command received from the host is a write command, then, at step 404, the first example method includes configuring the vendor-specific register based on the data field of the write command to enable and/or disable the vendor-specific functionality, which may be performed, for example, by the control circuitry of the memory module 100 (e.g., a concatenator 103). In some example embodiments, multiple write commands may be sent by the host device 109 to configure multiple registers in the vendor-specific register bank 106.

At step 405, the first example method includes controlling vendor-specific operations performed in the memory array 108 and/or processing data stored in the memory array 108 to enable and/or disable the vendor-specific functionality, which may be performed, for example, by a concatenator 103. Some example embodiments may include sending control signals to the CA bus handler 105. In some example embodiments, the control signals may cause the control circuitry of the memory module 100 to manage, limit, or alter the scope of commands, received from the host device 109, to perform normal operations on the memory array 108.

The various actions in the flowchart 400 may be performed in the order presented, in a different order, or simultaneously. Further, in some example embodiments, some actions listed in FIG. 4A may be omitted.

FIG. 4B is a flowchart 406 depicting a second example method of enabling and/or disabling vendor-specific functionalities in the memory 100 by configuring registers in the vendor-specific register bank 106, according to some example embodiments as disclosed herein.

At step 407, the second example method includes switching the memory 100 to the programming mode. In an example embodiment, a sequence of commands may be used for switching the memory 100 to the programming mode, which may be performed, for example, by the control circuitry of the memory module 100 (e.g., an MRS command decoder 101). The command sequence may be defined by a specific vendor. In some example embodiments, the control circuitry may be configured to fetch the command sequence and switch the memory 100 to the programming mode.

The functionality of the steps 408-411 are identical to that of the steps 402-405, which have been described in FIG. 4A. For the sake of brevity, the contents are not repeated here.

The various actions in the flowchart 406 may be performed in the order presented, in a different order, or simultaneously. Further, in some example embodiments, some actions listed in FIG. 4B may be omitted.

Figure 5A:
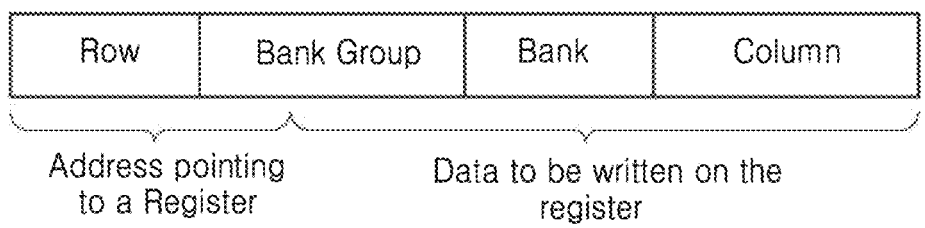
FIG. 5A depicts an example organization of address and data fields of a memory command used by control circuitry to configure registers in the vendor-specific register bank of the memory module, according to some example embodiments as disclosed herein.

FIG. 5A depicts an example organization of address and data fields of a standard memory command used for configuring registers in the vendor-specific register bank 106 of the memory 100, according to some example embodiments as disclosed herein. In some example embodiments, the control circuitry of the memory module 100 may be configured to utilize standard memory RD/WR commands for configuring registers in the vendor-specific register bank 106. As depicted in FIG. 5A, a standard memory RD/WR command may include four fields that respectively identify a row, bank group, bank, and column. For example, the standard memory RD/WR command may cause the control circuitry to perform operations directly on the memory array 108. In some example embodiments, the control circuitry may be configured to utilize the fields of the standard memory RD/WR command to include the address field that identifies a vendor-specific register; and the data field, which the control circuitry may be configured to use to configure the vendor-specific registers in the vendor-specific register bank 106. Some example embodiments may include defining a boundary between the address and data fields, based on vendor-specific specifications.

In some example embodiments, the control circuitry e.g., the concatenator 103) may be configured to capture row addresses using the contents of a bank activate field of a RD/WR command. In some example embodiments, the control circuitry may be configured to use standard RD/WR commands to configure the vendor-specific registers in the vendor-specific register bank 106 and to retrieve data from the vendor-specific registers in the vendor-specific register bank 106. The control circuitry (e.g., the concatenator 103) may be configured to use the captured details to form an address and data field to configure registers in the vendor-specific register bank 106.

Figure 5B:
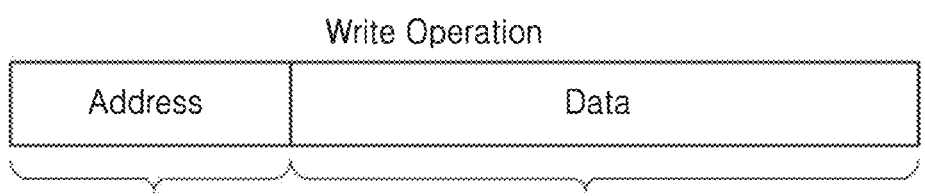
FIG. 5B depicts the address and data fields of a Write command to configure a register in the vendor-specific register bank, according to some example embodiments as disclosed herein.

FIG. 5B depicts the address and data fields of a write command to configure a register in the vendor-specific register bank 106, according to some example embodiments as disclosed herein. In some example embodiments, while the memory module 100 is in the programming mode, the register in the vendor-specific register bank 106 may be configured by the host device 109 sending a standard memory write command. In some example embodiments, the control circuitry may be configured to determine that a write command has been received from the host device 109 through the bus. The control circuitry may be configured to interpret the write command as having address and fields based on the vendor-specific logic. The address field may identify a register that is to be configured, and the data field may include the information which may be used to configure the register. Based on the configuration of the register, the control circuitry may be configured to enable and/or disable the vendor-specific functionality.

Figure 5C:
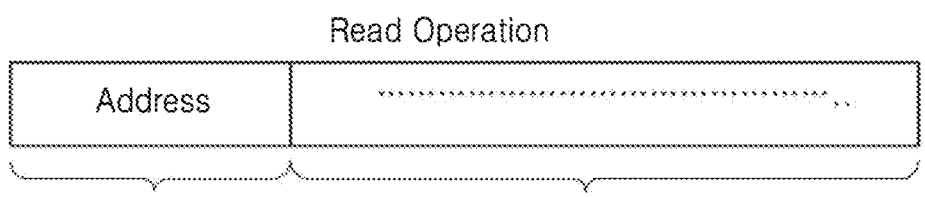
FIG. 5C depicts the address and data fields of a Read command to read a vendor-specific register in the vendor-specific register bank, according to some example embodiments as disclosed herein.

FIG. 5c depicts the address and data fields of a read command to retrieve contents of a register in the vendor-specific register bank 106, according to some example embodiments as disclosed herein. When the vendor-specific register is to be read, a read operation may be performed. The contents of register may be read either in serial or in parallel based on bits in the mode register. If the memory module 100 is in the programming mode, and a read operation is received, then the address field may refer to the register in the vendor-specific register bank 106 whose content is to be read. The content in the data field of the read command may be null or its contents may be disregarded.

Figure 6:
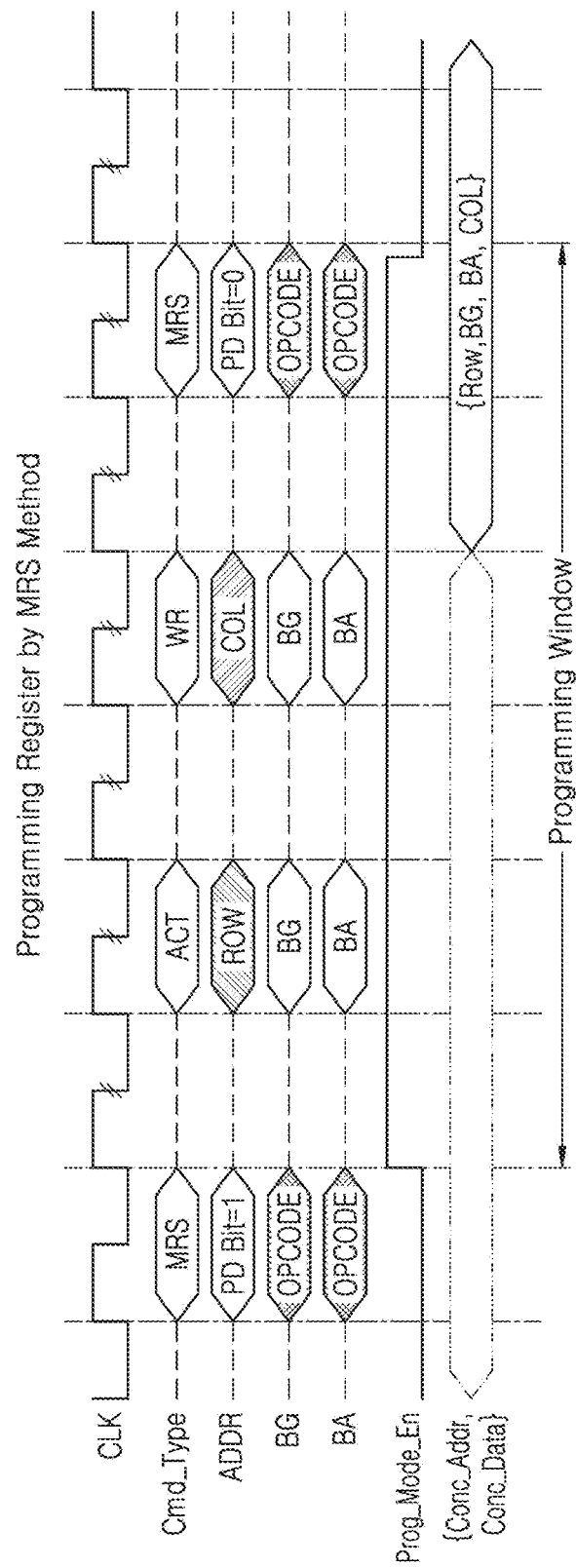
FIG. 6 is an example timing diagram depicting an operation of programming the memory module, according to some example embodiments as disclosed herein.

FIG. 6 is an example timing diagram depicting the operation of programming the memory 100, according to some example embodiments as disclosed herein. For example and as depicted in FIG. 6, Cmd_type may be a representation of standard memory commands. PD_Bit may be a description of a bit in MRS command. When the host device 109 sends a MRS command with the bit set, the control circuitry may be configured to switch the memory module 100 to the programming mode. Prog_Mode_En may be a description of register value of the programming mode enable register 102. In the programming window, the control circuitry (e.g., the concatenator 103) may be configured to capture Row address (ROW), Bank Group (BG), Bank Address (BA), and Column Address (COL) as part of Activate (ACT) and Write (WR) commands. When the write command is issued by the host device 109, the control circuitry may be configured to program one specific register in vendor-specific register bank 106. The control circuitry may be configured to switch the memory module 100 out of the programming mode by issuing another MRS command with the bit in the MRS command reset.

Figure 7:
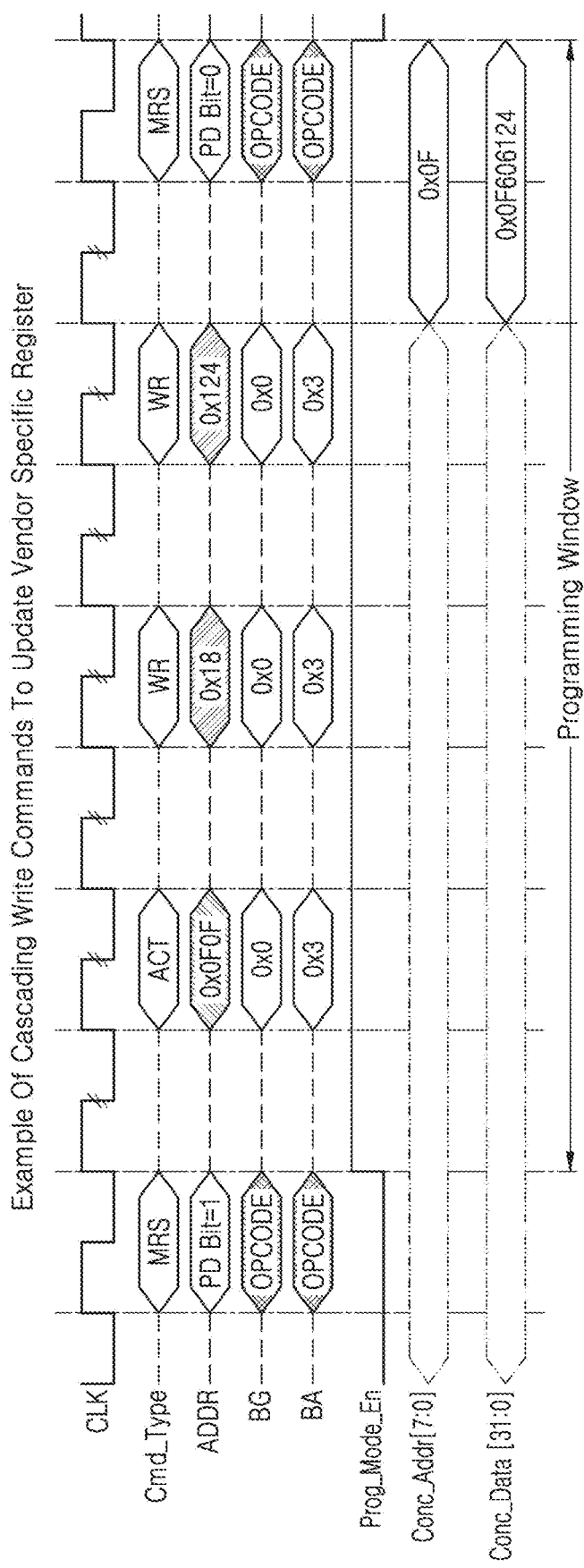
FIG. 7 is an example timing diagram depicting the operation of cascading write commands to configure a register in the vendor-specific register bank, according to some example embodiments as disclosed herein.

FIG. 7 is an example timing diagram depicting the operation of cascading write commands to configure a register in the vendor-specific register bank 106, according to some example embodiments as disclosed herein. As depicted in FIG. 7, Conc_Addr [7:0] and Conc_Data [31:0] may represent address and data fields of a write command received by the concatenator 103 through the bus to configure a register in the vendor-specific register bank 106. Cascaded write commands may be used when the vendor-specific register in the vendor-specific register bank 106 utilizes more bits than the bits sampled from a single write command. The control circuitry (e.g., the concatenator 103) may wait for the subsequent write (cascaded) commands to be issued by the host device 109. Once a number of cascaded write commands have been received, the control circuitry (e.g., the concatenator 103) may be configured to configure the register in vendor-specific register bank 106.

Figure 8:
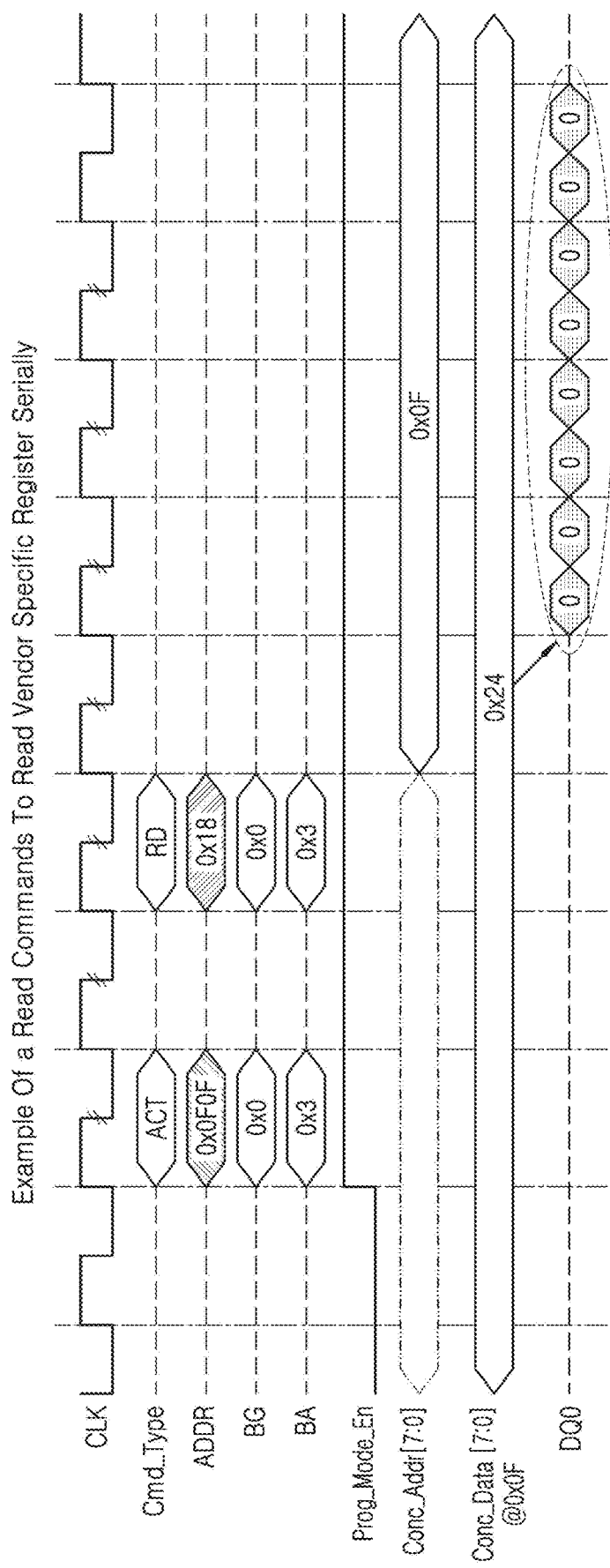
FIG. 8 is an example timing diagram depicting the operation of serial reading of contents of a register in the vendor-specific register bank, according to some example embodiments as disclosed herein.

FIG. 8 is an example timing diagram depicting the operation of serial reading of contents of a register in the vendor-specific register bank 106, according to some example embodiments as disclosed herein. As depicted in FIG. 8, Conc_DATA [7:0] @0x0F may represent the content of a vendor-specific register at the location 0x0F, which is 0x24. The data in the vendor-specific register may be read by the host device 109 serially in one of the DO pins (which is DQ0 in this example) using a read command. The host device 109 may receive the data and extract the data.

Figure 9A:
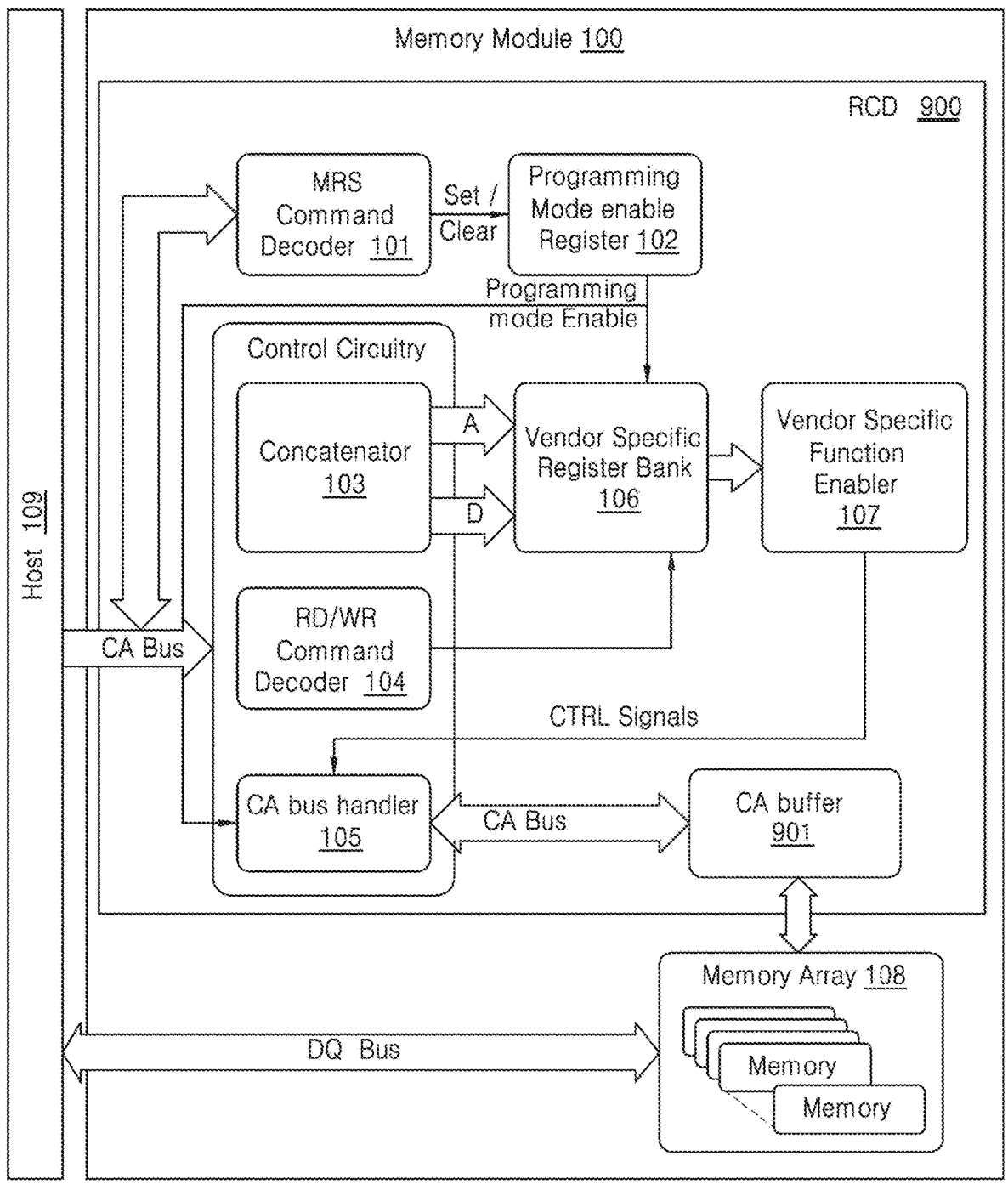
FIG. 9A depicts an example implementation of vendor-specific functionality on a Register Clock Driver (RCD) of a Dual Inline Memory Module (DIMM), according to some example embodiments as disclosed herein.

FIG. 9A depicts the memory 100 capable of performing vendor-specific functions, according to some example embodiments as disclosed herein. In an example embodiment, the memory 100 may be a DIMM. As depicted in FIG. 9A, the memory module 100 may include the RCD 900. The control circuitry of the RCD 900 may include an MRS command decoder 101, a concatenator 103, a RD/WR command decoder 104, and a CA bus handler 105. The memory module 100, including the control circuitry, may also include a programming mode enable register 102, vendor-specific register bank 106, vendor-specific function enabler 107, and a CA buffer 901. In some example embodiments, the memory array 108 in the memory module 100 may be outside the RCD 900. The control circuitry (e.g., the CA buffer 901) may be configured to enable buffering of the CA bus between the host device 109 and the memory array 108, which may improve signal integrity of the CA bus. The functionality of the components of the RCD 900 (apart from the CA buffer 901) may be identical to that of FIG. 1. The connections of the components within the RCD 900, connections between the RCD 900 and the memory array 108 with the host device 109 may be identical to that of FIG. 1.

Some example embodiments may include control circuitry that is configured to configure the vendor-specific registers of the vendor-specific register bank 106 in the RCD 900. The RCD 900 in the memory module 100 may have visibility of the CA bus. In some example embodiments, the control circuitry may be configured to introduce vendor-specific control logic on the RCD for controlling the access to the memory array 108 in the memory module 100. The vendor-specific registers may be unreadable while the RCD 900 is not connected to DQ bus. In some example embodiments, the control circuitry may be configured to customize the memory module 100 by an access to DO pin(s) by the RCD 900.

Figure 9B:
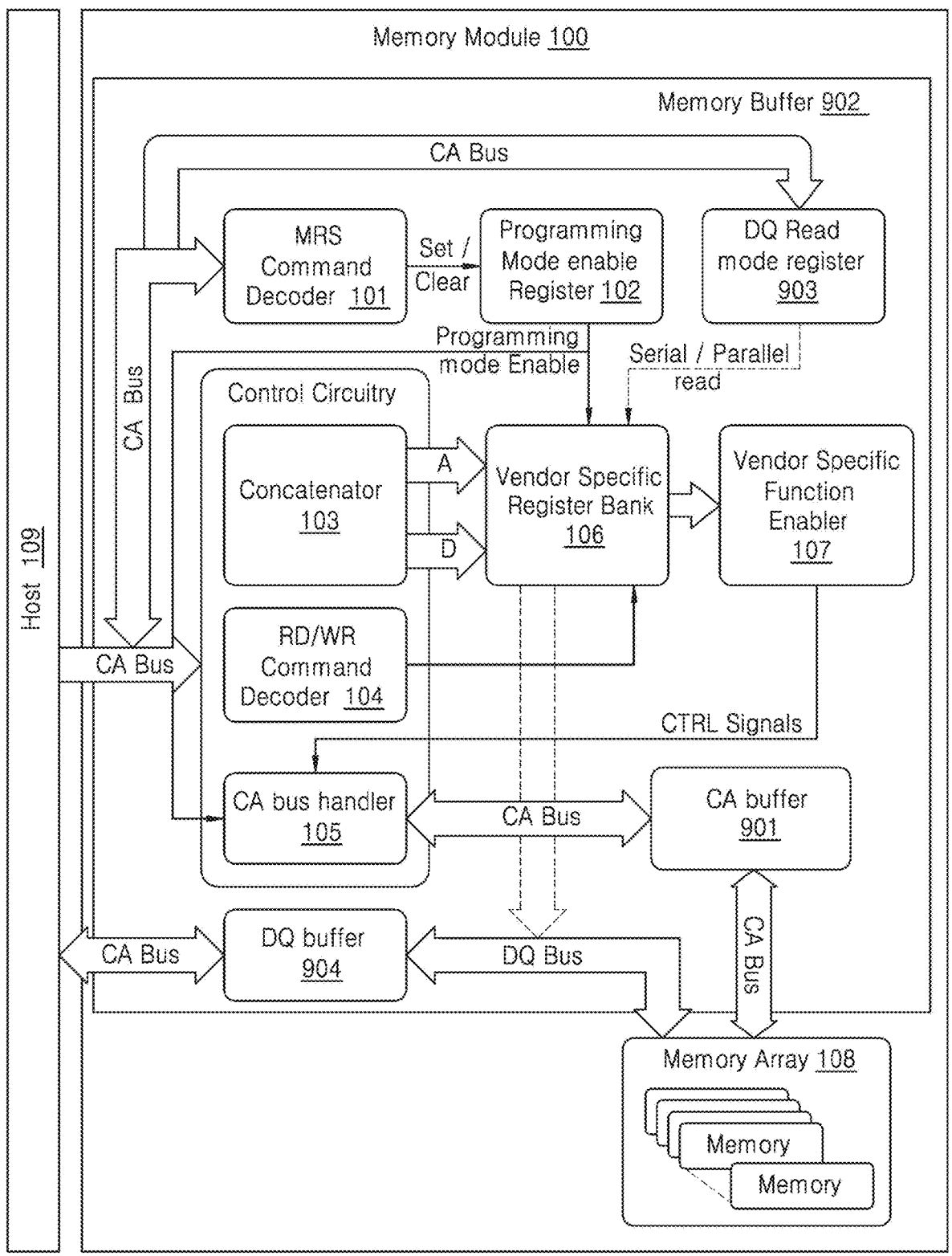
FIG. 9B depicts an example implementation of vendor-specific functionality on a memory buffer of the DIMM, according to some example embodiments as disclosed herein.

FIG. 9B depicts a memory module 100 that is capable of performing vendor-specific functions, according to some example embodiments as disclosed herein. In some example embodiments, the memory module 100 may be a DIMM. As depicted in FIG. 9B, the memory module 100 includes the memory buffer 902. The control circuitry of the memory buffer 902 may include an MRS command decoder 101, a concatenator 103, an RD/WR command decoder 104, a CA bus handler 105, a vendor-specific register bank 106, a vendor-specific function enabler 107, a CA buffer 901, a DO read mode register 903, and DQ buffers 904. In the example embodiment of FIG. 9B, the memory array 108 may be outside the memory buffer 902. The functionality of the components of the memory buffer 902 (apart from the CA buffer 901, DO read mode register 903, and DQ buffers 904) may be identical to that of FIG. 1. The DO buffer 904 and CA buffer 901 may be configured to act as buffers in the memory buffer 902 to enable buffering between the host device 109 and the memory array 108. This is used in the memory module 100 to provide support for having a large memory capacity and better signal integrity.

In some example embodiments, the configuration of the memory module 100 may facilitate inclusion of vendor-specific hardware accelerators on DRAM, which would otherwise necessitate having customer register space. In some example embodiments, the configuration of the memory module 100 may facilitate the definition of vendor-defined data patterns for DO training, such as establishing the timing of signals and/or the configuration of the data bus. In some example embodiments, the configuration of the memory module 100 may facilitate simplified implementation of vendor-specific logic on DRAM, as additional logic may not be introduced in the DO lines for configuring the vendor-specific registers. In some example embodiments, the configuration of the memory module 100 may facilitate programming of the vendor-specific registers irrespective of training of the DO lines.

In some example embodiments, customization of a host memory controller may be prevented, as standard write commands may be used for configuring the vendor-specific registers. In some example embodiments, the configuration of the memory module 100 may facilitate configuring the vendor-specific registers when the MR space is not sufficient for configuring vendor-specific register space.

In some example embodiments, the control circuitry may be implemented through a software program running on a hardware device and performing network management functions to control the network elements. The network elements shown in FIG. 1 include blocks which may be a hardware device, a plurality of hardware devices, and/or a combination of hardware device and software.

Some example embodiments may include methods, memory modules 100, and control circuitry configured to configure vendor-specific register space in the memory modules 100 to enable and/or disable vendor-specific functionality in the memory modules 100. It is to be understood that the scope of the protection is extended to such a program and in addition to a computer readable medium having a message therein, such computer-readable storage medium contain program code that implements one or more steps of the method, when the program runs on a server or mobile device or any suitable programmable device. An example method, memory module 100, and/or example control circuitry may include a software program written in, for example, Very high speed integrated circuit Hardware Description Language (VHDL) and/or another programming language, and/or implemented by one or more VHDL or several software being executed on a hardware device. The hardware device may be any kind of portable device that may be programmed. The memory module 100 and/or the control circuitry may include, for example, hardware, or a combination of hardware and software, for example, an application-specific integrated circuit (ASIC) and/or a field-programmable gate array (FPGA), or one or more microprocessors and memory with software located therein. In some example embodiments, the memory module 100 and/or the control circuitry may be non-volatile and/or non-transitory. Some example embodiments may include a method that is implemented partly in hardware and partly in software. Alternatively, some example embodiments may be implemented on different hardware devices including various types of control circuitry, for example, using a plurality of processors.

The foregoing description of some example embodiments may enable persons of ordinary skill in the art, by applying current knowledge, to modify and/or adapt the disclosed subject matter for various applications of some example embodiments, and, therefore, such adaptations and modifications are intended to be included within the meaning and range of equivalents of the disclosed example embodiments. It is to be understood that the phraseology or terminology employed herein is for the purpose of description and not of limitation. Therefore, while some example embodiments are described herein, those of ordinary skill in the art may recognize that some example embodiments herein may be practiced with modification within the spirit and scope of some example embodiments as described herein.

As used herein, the terms "when" and "while" may, but are not necessarily intended to, imply a chronological relationship such as a sequence of events. For example, operations that are described as occurring "when" or "while" a condition is fulfilled may be performed concurrently with the fulfillment of the condition or after the fulfillment of the condition, or, alternatively, because the condition is fulfilled irrespective of timing. All such interpretations that are reasonably and logically possible, and that are not contradictory with other statements, are intended to be included in this disclosure, the scope of which is to be understood as being limited only by the claims.

We claim:

1. A method for configuring a vendor-specific register in a memory module, the method comprising:
   receiving a command from a host device to switch the memory module to a programming mode;
   switching the memory module to the programming mode responsive to the command;
   receiving a memory write command from the host device involving the memory module switched to the programming mode; and
   configuring the vendor-specific register based on the memory write command and an organization of the vendor-specific register indicated by a vendor-specific logic,
   wherein the vendor-specific logic indicates a size of at least one field included in the memory write command,
   wherein the method further includes reading contents of the vendor-specific register based on a memory read command, wherein the reading is performed in series or in parallel, and
   wherein the memory read command includes a first address field that identifies the vendor-specific register and a first data field that is disregarded.

2. The method, as claimed in claim 1,
   wherein the at least one field of the memory write command includes a second address field and a second data field, and
   wherein the vendor-specific logic indicates that the second address field and the second data field are organized by a number of bits.

3. The method, as claimed in claim 2, wherein the vendor-specific logic specifies a first number of bits for the second address field and a second number of bits for the second data field.

4. The method, as claimed in claim 2,
   wherein the second address field identifies the vendor-specific register, and
   wherein the vendor-specific register is configured based on the second data field.

5. The method, as claimed in claim 1, further comprising:
   enabling vendor-specific functionality of the memory module based on the vendor-specific logic.

6. The method, as claimed in claim 1, further comprising:
   switching the memory module out of the programming mode by a mode register set command, and
   controlling, by command and address (CA) bus handler, operations on the memory module, performed by the host device through a CA bus, based on control signals received from a vendor-specific function enabler, wherein the operations are selected from an operation set including,
   a modified operation,
   a restricted operation,
   an enabled operation, and
   a disabled operation.

7. The method, as claimed in claim 6, wherein the memory module is switched to the programming mode based on a value of a bit in the mode register set command.

8. The method, as claimed in claim 1,
   wherein a command sequence sets the memory module in the programming mode, and
   wherein the command sequence is defined by the vendor-specific logic.

9. A memory module comprising:
   at least one vendor-specific register; and
   control circuitry configured to, receive a command from a host device to switch the memory module to a programming mode, switch the memory module to the programming mode responsive to the command, receive a memory write command from the host device involving the memory module switched to the programming mode, and configure the at least one vendor-specific register based on the memory write command and an organization of the at least one vendor-specific register based on a vendor-specific logic, wherein the vendor-specific logic is configured to indicate a size of at least one field included in the memory write command, wherein the memory module is further configured read the at least one vendor-specific register responsive to a memory read command, wherein the reading is performed in series or in parallel, and wherein the memory read command includes a first address field that identifies the at least one vendor-specific register and first data field that is disregarded.

10. The memory module, as claimed in claim 9, wherein the memory write command includes a second address field and a second data field, and wherein the second address field and the second data field are organized by a number of bits.

11. The memory module, as claimed in claim 10, wherein the vendor-specific logic indicates a first number of bits for the second address field and a second number of bits for the second data field.

12. The memory module, as claimed in claim 10, wherein the second address field identifies the at least one vendor-specific register, and wherein the control circuitry is further configured to configure the at least one vendor-specific register is based on the vendor-specific logic and the second data field.

13. The memory module, as claimed in claim 9, wherein the control circuitry is further configured to perform an operation on the memory module, based on the vendor-specific logic, to enable vendor-specific functionality on the memory module.

14. The memory module, as claimed in claim 9, wherein, the control circuitry is further configured to switch the memory module out of the programming mode in response to a mode register set command, and the control circuitry is further configured to control operations on the memory module based on control signals received from a vendor-specific function enabler, wherein the operations are selected from an operation set including, a modified operation, a restricted operation, an enabled operation, and a disabled operation.

15. The memory module, as claimed in claim 14, wherein the control circuitry is further configured to perform the switching of the memory module to the programming mode responsive to the command and is based on a value of a bit in the mode register set command.

16. The memory module, as claimed in claim 9, wherein the control circuitry is further configured to switch the memory module to the programming mode based on a sequence of commands that is defined by the vendor-specific logic.

* * * * *